(12) United States Patent
Qiu

(10) Patent No.: US 11,167,603 B2
(45) Date of Patent: Nov. 9, 2021

(54) TIRE PRESSURE SENSOR

(71) Applicant: AUTEL INTELLIGENT TECHNOLOGY CORP., LTD., Guangdong (CN)

(72) Inventor: Longxue Qiu, Guangdong (CN)

(73) Assignee: AUTEL INTELLIGENT TECHNOLOGY CORP., LTD., Shenzhen (CN)

( * ) Notice: Subject to any disclaimer, the term of this patent is extended or adjusted under 35 U.S.C. 154(b) by 17 days.

(21) Appl. No.: 16/735,170

(22) Filed: Jan. 6, 2020

(65) Prior Publication Data

US 2020/0139771 A1    May 7, 2020

Related U.S. Application Data

(63) Continuation of application No. PCT/CN2018/094539, filed on Jul. 4, 2017.

(30) Foreign Application Priority Data

Jul. 6, 2017    (CN) .......................... 201710546721.6

(51) Int. Cl.
*B60C 23/04* (2006.01)
*H01Q 23/00* (2006.01)
*H05K 1/18* (2006.01)

(52) U.S. Cl.
CPC ......... *B60C 23/0452* (2013.01); *H01Q 23/00* (2013.01); *H05K 1/18* (2013.01); *H05K 2201/10151* (2013.01)

(58) Field of Classification Search
CPC ...... B60C 23/0452; H01G 23/00; H05K 1/18; H05K 2201/10151

(Continued)

(56) References Cited

U.S. PATENT DOCUMENTS 8,072,335 B2 * 12/2011 Duzdar ............... B60C 23/0433
340/572.7
9,385,761 B2 * 7/2016 Nakatani .................. H01Q 1/34
(Continued)

FOREIGN PATENT DOCUMENTS

EP    2574480 A2    4/2013
EP    2639880 A1    9/2013

OTHER PUBLICATIONS

European Search Report Application No. 18827651.3; dated Dec. 10, 2020.

*Primary Examiner* — Kam Wan Ma

(57) ABSTRACT

The present invention provides a tire pressure sensor, including a housing, a PCBA installed within the housing, a power supply device installed within the housing and electrically connected to the PCBA, and an antenna connected to the PCBA. The antenna is wrapped around the PCBA, and at least one turn of the antenna is wrapped around the PCBA. An effective space of the antenna may be particularly enlarged by wrapping the antenna around the PCBA, thereby improving efficiency of the antenna, increasing a signal transmitting distance of the antenna, and enhancing signal transmission stability and anti-interference capability of the antenna, so that an automobile receiver can stably receive, in real time, information such as internal pressure and a temperature of the tire detected by the PCBA, better implementing real-time monitoring of the air pressure, the temperature, and the like within the tire.

19 Claims, 3 Drawing Sheets

(58) Field of Classification Search
USPC .......................................................... 340/447
See application file for complete search history.

(56) References Cited

U.S. PATENT DOCUMENTS

| | | | | |
|---|---|---|---|---|
| 9,821,613 | B2* | 11/2017 | Patterson | ............... B60C 23/008 |
| 2006/0077051 | A1* | 4/2006 | Chen | ................... B60C 23/0408 |
| | | | | 340/447 |
| 2010/0164705 | A1* | 7/2010 | Blanchard | ........... B60C 23/0411 |
| | | | | 340/442 |
| 2013/0167999 | A1* | 7/2013 | Nakatani | ................. B60C 23/04 |
| | | | | 152/450 |
| 2016/0176247 | A1* | 6/2016 | Cheikh | ............... B60C 23/0444 |
| | | | | 340/447 |

* cited by examiner

TIRE PRESSURE SENSOR

CROSS-REFERENCE

This application is a continuation of International Patent Application No. PCT/CN20181094539 filed on Jul. 4, 2018, which claims priority to Chinese Patent Application No. 201710546721.6 filed on Jul. 6, 2017, both of which are incorporated by reference herein in their entireties.

BACKGROUND

Technical Field

The present invention relates to the field of tire pressure detection technologies, and in particular, to a tire pressure sensor.

Related Art

An automobile tire is an important part of an automobile and plays a vital role in ensuring safe driving of the automobile. A tire pressure monitoring system is used to automatically monitor tire pressure in real time during automobile driving, and to give an alarm for tire leakage and low air pressure, thereby ensuring driving safety. The tire pressure monitoring system includes a tire pressure sensor. The tire pressure sensor generally includes a housing and a printed circuit board assembly (PCBA) installed within the housing, a power supply device, and an antenna. The PCBA detects information such as internal pressure and temperature of the tire, and the antenna transmits the detected information to a receiver of an automobile. In order to implement real-time monitoring of air pressure, a temperature, etc. within the tire, it is required that a signal of the antenna is transmitted stably with a remote transmission distance, and strong anti-interference capability.

However, in order not to affect normal installation of the tire, a volume of the tire pressure sensor is generally required to be relatively small, which causes a very limited inner space of the tire pressure sensor, thereby limiting an installation space of the antenna. Therefore, how to make full use of the limited internal space of the tire pressure sensor and rationally design a shape and a structure of the antenna become a problem that is urgently to be resolved in the prior art.

SUMMARY

Therefore, a technical problem to be resolved by the present invention is to overcome a defect that a relatively small effective space for an antenna of a tire pressure sensor causes a short signal transmitting distance, signal transmission instability, and weak anti-interference capability of the antenna, thereby providing a tire pressure sensor with a relatively large effective space of the antenna, a remote signal transmitting distance of the antenna, signal transmission stability, and strong anti-interference capability.

The present invention provides a tire pressure sensor, including a housing, a PCBA installed within the housing, a power supply device installed within the housing and electrically connected to the PCBA, and an antenna connected to the PCBA. The antenna is wrapped around the PCBA, and at least one turn of the antenna is wrapped around the PCBA.

Two turns of the antenna are wrapped around the PCBA.

A face enclosed by each turn of the antenna wrapped around the PCBA is not in a same plane with a board face of a PCB of the PCBA.

The face enclosed by each turn of the antenna wrapped around the PCBA is perpendicular to the board face of the PCB.

A shape enclosed by each turn of the antenna is cut into two portions by an extending face of the PCB of the PCBA, the two portions being respectively a first portion of the PCB at a side away from a wheel hub and a second portion of the PCB at a side close to the wheel hub, and the first portion having an area larger than that of the second portion.

The antenna is disposed away from the PCBA at a side of the PCBA away from the wheel hub and disposed close to the PCBA at a side of the PCBA close to the wheel hub.

The antenna is connected to a side of the PCBA close to the wheel hub.

The antenna is wrapped around an end of the PCBA away from the power supply device.

The antenna is snap-fitted on an inner wall of the housing.

The housing includes an upper housing and a lower cover detachably connected to the upper housing, and slots for positioning and installing the antenna are respectively disposed on inner walls of the upper housing and the lower cover.

Technical solutions of the present invention have the following advantages:

1. For the tire pressure sensor provided in the present invention, the antenna is wrapped around the PCBA, and a length of the antenna may be increased within a limited internal space of the tire pressure sensor, and an effective space of the antenna may be particularly enlarged by wrapping the antenna around the PCBA, thereby improving efficiency of the antenna, increasing a signal transmitting distance of the antenna, and enhancing signal transmission stability and anti-interference capability of the antenna, so that an automobile receiver can stably receive, in real time, information such as internal pressure and a temperature of the tire detected by the PCBA, better implementing real-time monitoring of the air pressure, the temperature, and the like within the tire.

2. For the tire pressure sensor provided in the present invention, at least two turns of the antenna are wrapped around the PCBA to increase an effective length of the antenna, further enlarging the effective space of the antenna and improving efficiency of the antenna.

3. For the tire pressure sensor provided in the present invention, a face enclosed by each turn of the antenna wrapped around the PCBA has an angle with a board face of a PCB of the PCBA, so that the effective space of the antenna can be enlarged, further improving the efficiency of the antenna.

4. For the tire pressure sensor provided in the present invention, the face enclosed by each turn of the antenna wrapped around the PCBA is perpendicular to the board face of the PCB, thereby maximizing the effective space of the antenna and improving the efficiency of the antenna.

5. For the tire pressure sensor provided in the present invention, a shape enclosed by each turn of the antenna is cut into two portions by an extending face of the PCB of the PCBA, the two portions being respectively a first portion of the PCB at a side away from a wheel hub, and a second portion of the PCB at a side close to the wheel hub, the first portion having an area larger than that of the second portion. That is, the antenna is entirely disposed away from the wheel hub, so that interference of the wheel hub to the signal of the antenna can be reduced.

6. For the tire pressure sensor provided in the present invention, the antenna is disposed away from the PCBA at a side of the PCBA away from the wheel hub and disposed close to the PCBA at a side of the PCBA close to the wheel hub, so that the antenna is disposed integrally farthest away from the wheel hub, better reducing interference of the wheel hub to the signal of the antenna.

7. For the tire pressure sensor provided in the present invention, the antenna is wrapped around an end of the PCBA away from the power supply device, so that interference of the power supply device to the signal of the antenna can be reduced.

8. For the tire pressure sensor provided in the present invention, the antenna is snap-fitted on an inner wall of the housing, and the antenna is limited and fixed, so that the antenna can stably send a signal.

BRIEF DESCRIPTION OF THE DRAWINGS

To describe the technical solutions in the detailed description of embodiments of the present invention or in the prior art more clearly, the following briefly describes the accompanying drawings required for describing the detailed description of embodiments or the prior art. Apparently, the accompanying drawings in the following description show some embodiments of the present invention, and those of ordinary skill in the art may still derive other drawings from these accompanying drawings without creative efforts.

DESCRIPTION OF REFERENCE NUMERALS

1—Upper housing, 2—Lower cover, 3—PCBA, 31—PCB, 4—Power supply device, 5—Antenna, 6—Slot.

DETAILED DESCRIPTION

The technical solutions of the present invention will be clearly and completely described below with reference to the accompanying drawings. Apparently, the described embodiments are merely some rather than all of the embodiments of the present invention. All other embodiments obtained by one of ordinary skill in the art based on the embodiments of the present invention without creative efforts shall fall within the protection scope of the present invention. It should be noted that an element described as being "connected" to another element may be directly connected to the other element, or one or more intervening components may be present. As used in the specification, orientation or position relationships indicated by the terms such as "upper", "lower", "inside", and "outside" are based on orientation or position relationships shown in the accompanying drawings, and are used only for ease and brevity of illustration and description, rather than indicating or implying that the mentioned apparatus or component needs to have a particular orientation or needs to be constructed and operated in a particular orientation. Therefore, such terms should not be construed as limiting of the present invention. In addition, the terms such as "first", "second", and "third" are used only for the purpose of description, and should not be understood as indicating or implying relative importance.

In addition, the technical features provided in different embodiments of the present invention to be described below may be combined with each other as long as no conflict occurs.

Figure 1:
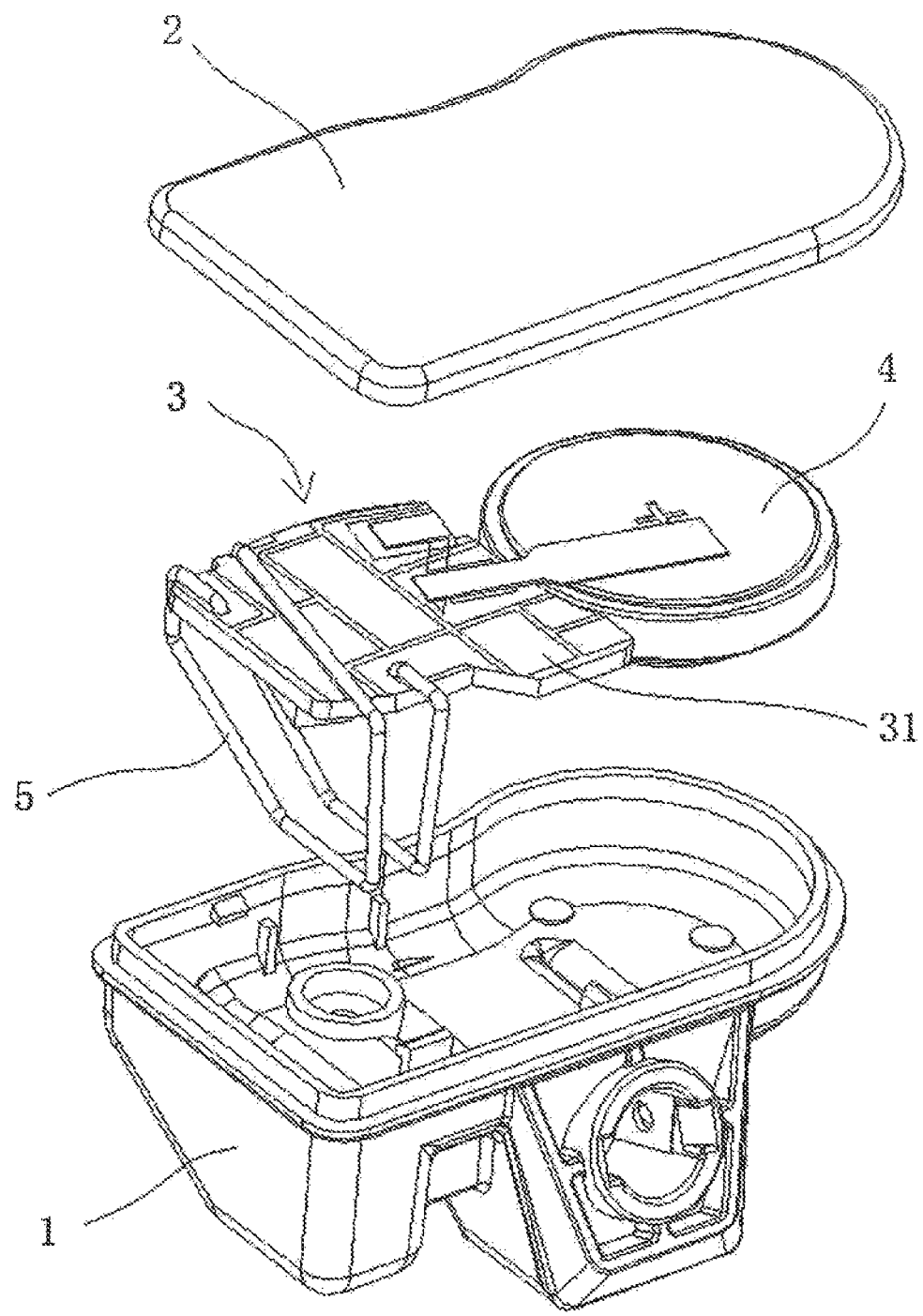
FIG. 1 is a three-dimensional exploded view of a tire pressure sensor according to an embodiment of the present invention.
Figure 2:
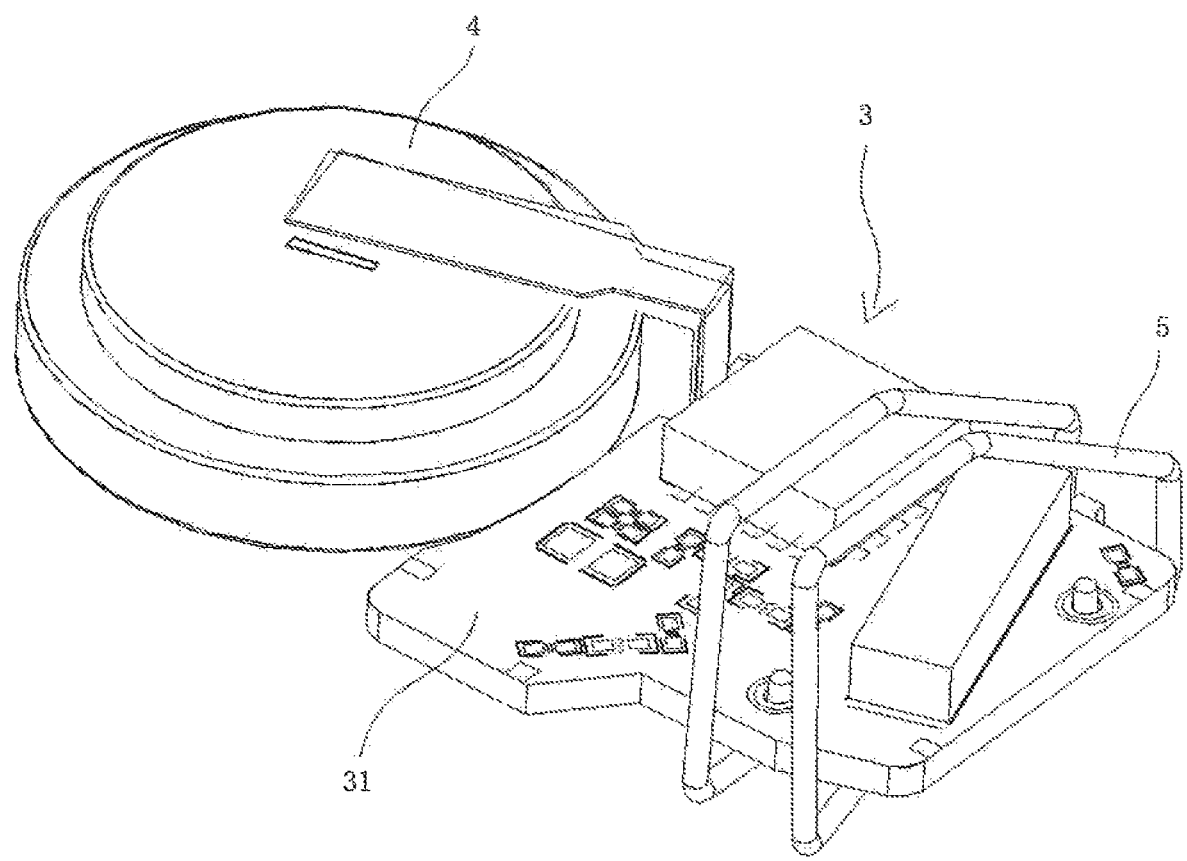
FIG. 2 is a schematic three-dimensional view of a tire pressure sensor without a housing shown in FIG. 1.

As shown in FIG. 1 and FIG. 2, this embodiment provides a tire pressure sensor, including a housing, a PCBA 3, a power supply device 4, and an antenna 5. The PCBA 3, the power supply device 4, and the antenna 5 are respectively installed within the housing. The power supply device 4 is located at an end of the antenna 5 and is electrically connected to the PCBA 3. The antenna 5 is connected to the PCBA 3. In an embodiment, the antenna 5 is wrapped around the PCBA 3.

The power supply device 4 may be a battery, or may be other devices that may supply or store electrical energy, such as a thermoelectric conversion device.

In an embodiment, the antenna 5 is wrapped around the PCBA 3, a length of the antenna 5 may be increased within a limited internal space of the tire pressure sensor, and effective space of the antenna 5 may be particularly enlarged by wrapping the antenna around the PCBA 3, thereby improving efficiency of the antenna 5, increasing a signal transmitting distance of the antenna 5, and enhancing signal transmission stability and anti-interference capability of the antenna 5, so that a receiver in an automobile can stably receive, in real time, information such as internal pressure and a temperature of the tire detected by the PCBA 3, better implementing real-time monitoring of the air pressure, the temperature, and the like within the tire.

The antenna 5 may be an antenna supporting a single frequency, or may be a composite antenna supporting two or more frequencies, such as a composite antenna supporting both 433 MHZ frequency and 315 MHZ frequency.

In an embodiment, the number of turns of the antenna 5 wrapped around the PCBA 3 is determined according to a specific use condition, which may be one turn, two turns, or a plurality of turns. The more number of the turns leads to a longer effective length of the antenna 5. Two adjacent turns of the antenna are parallel, and a spacing between the two adjacent turns of the antenna is within a suitable range. In this embodiment, two turns of the antenna 5 are wrapped around the PCBA 3, a shape enclosed by each turn of the antenna and the PCBA 3 is a pentagon. In some other embodiments, the shape may be a triangle, a quadrangle, or other polygons.

In order to maximize the effective space of the antenna 5 and improve the efficiency of the antenna 5, a face enclosed by each turn of the antenna 5 wrapped around the PCBA 3 is not in a same plane with a board face of the PCB 31. In this embodiment, the face enclosed by each turn of the antenna 5 wrapped around the PCBA 3 is perpendicular to the board face of the PCB 31, that is, the face enclosed by each turn of the antenna 5 wrapped around the PCBA 3 has an angle of 90° with the board face of the PCB 31 of the PCBA 3. As an alternative manner, the face enclosed by each turn of the antenna 5 wrapped around the PCBA 3 has other angles such as 75° or 100° with the board face of the PCB 31 of the PCBA 3.

In some other embodiments, the face enclosed by each turn of the antenna 5 may be in a same plane with the board face of the PCB 31. For example, the antenna 5 is wrapped around a perimeter or four peripheries of the PCBA 3.

In order to reduce interference of the wheel hub to a signal of the antenna 5, a shape enclosed by each turn of the antenna 5 is cut into two portions by a plane in which the PCB 31 of the PCBA 3 is located. The two portions include a first portion of the PCB 31 at a side away from the wheel hub and a second portion of the PCB 31 at a side close to the wheel hub. The first portion has an area larger than that of the second portion. In this embodiment, the antenna 5 is disposed away from the PCBA 3 at a side of the PCBA 3 away from the wheel hub and disposed close to the PCBA 3 at a side of the PCBA 3 close to the wheel hub, so that the antenna 5 is disposed entirely farthest away from the wheel hub, better reducing interference of the wheel hub to the signal of the antenna 5.

The antenna 5 is connected to a side of the PCBA 3 close to the wheel hub.

In order to reduce interference of the power supply device 4 to the signal of the antenna 5, the antenna 5 is wrapped around an end of the PCBA 3 away from the power supply device 4.

Figure 3:
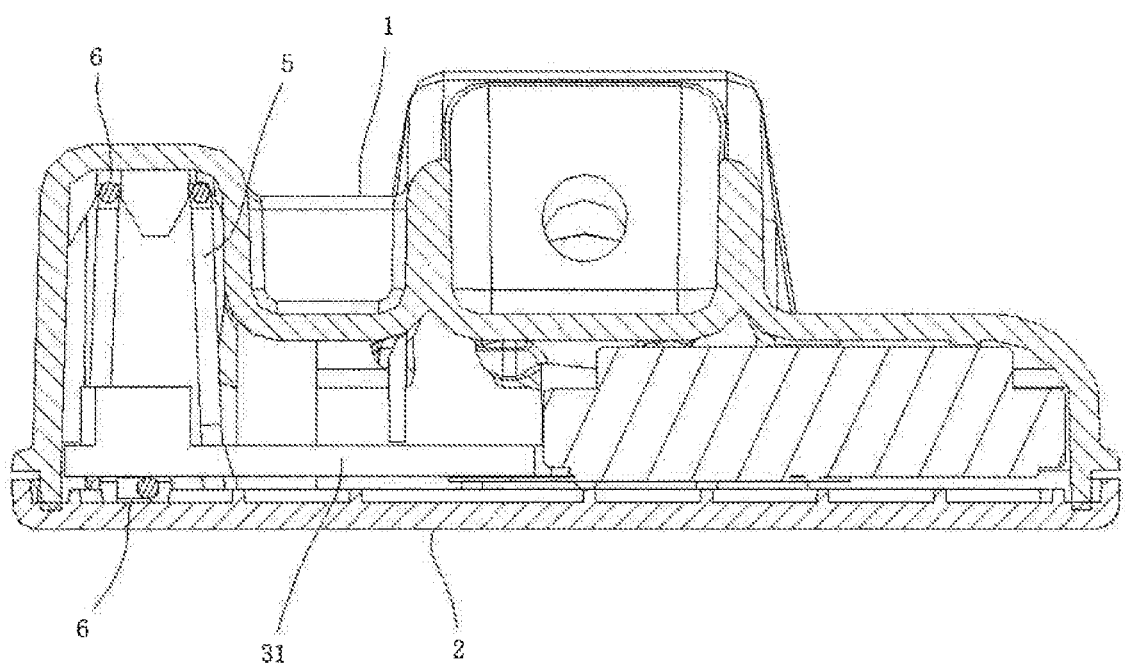
FIG. 3 is a cross-sectional view of the tire pressure sensor shown in FIG. 1.

A shown in FIG. 3, the housing in this embodiment includes an upper housing 1 and a lower housing 2 detachably connected to the upper housing 1. A compartment for accommodating the antenna 5 is within the upper housing 1. The shape of the compartment matches a shape of the antenna. Slots 6 for positioning and installing the antenna 5 are formed on the upper housing 1 and the lower cover 2, and the antenna 5 is engaged into the slots 6 and snap-fitted on the inner wall of the housing.

Apparently, the foregoing embodiments are merely examples provided for clarity of description, and are not intended to limit the implementation of the present invention. One of ordinary skill in the art may also make changes or variations in other different forms based on the foregoing descriptions. It is unnecessary and impossible to list all implementations herein. Any obvious change or variation that can be conceived of based on the foregoing descriptions shall fall within the protection scope of the present invention.

What is claimed is:

1. A tire pressure sensor, comprising:
    a housing;
    a printed circuit board assembly (PCBA) installed in the housing, the PCBA comprising a single printed circuit board and being configured to detect a tire pressure of a tire;
    a power supply device installed in the housing and electronically connected to the PCBA; and
    an antenna connected to the PCBA, wherein the antenna is disposed on the PCBA and comprises at least one turn, the antenna being configured to transmit a signal comprising a detection result of the tire pressure; wherein a first part of the antenna only surrounds the single printed circuit board, a second part of the antenna only passes through the single printed circuit board;
    wherein a face enclosed by each of the at least one turn is not in a same plane with a face of the single printed circuit board.

2. The tire pressure sensor according to claim 1, wherein the face enclosed by one turn of the antenna is perpendicular to the face of the single printed circuit board.

3. The tire pressure sensor according to claim 1, wherein the face enclosed by one turn of the antenna has an angle of 750 or 100° with the face of the single printed circuit board.

4. The tire pressure sensor according to claim 1, wherein the antenna is configured to support only a single frequency.

5. The tire pressure sensor according to claim 1, wherein the antenna is configured to support at least two frequencies.

6. The tire pressure sensor according to claim 5, wherein the antenna is configured to support both a 433 MHz frequency and a 315 MHz frequency.

7. The tire pressure sensor according to claim 1, wherein the antenna is disposed on one end of the PCBA away from the power supply device.

8. The tire pressure sensor according to claim 1, wherein the antenna is mounted on an inner wall of the housing.

9. The tire pressure sensor according to claim 1, wherein the housing comprises:
    an upper housing; and
    a lower housing detachably connected to the upper housing.

10. The tire pressure sensor according to claim 9, wherein slots for positioning and installing the antenna are respectively disposed on inner walls of the upper housing and the lower housing.

11. The tire pressure sensor according to claim 9, wherein a compartment is formed by the upper housing for accommodating the antenna.

12. The tire pressure sensor according to claim 9, wherein two separate compartments including a first compartment and a second compartment are formed by the upper housing and lower housing; wherein the first compartments is-are configured to accommodate the antenna, and the second compartments is-are configured to accommodate the PCBA and the power supply device.

13. The tire pressure sensor according to claim 1, wherein the antenna is wrapped around the PCBA.

14. The tire pressure sensor according to claim 13, wherein at least one turn of the antenna is wrapped around the PCBA.

15. The tire pressure sensor according to claim 13, wherein two turns of the antenna are wrapped around the PCBA.

16. The tire pressure sensor according to claim 13, wherein a shape enclosed by at least one turn of the antenna is cut into two portions by a plane in which the single printed circuit board of the PCBA is located; the two portions comprising a first portion cut by the single printed circuit hoard at a side away from a wheel hub, and a second portion cut by the single printed circuit hoard at a side close to the wheel hub, after the tire pressure sensor is installed on the tire; the first portion having an area larger than that of the second portion.

17. The tire pressure sensor according to claim 13, wherein the antenna is disposed away from the PCBA at a side of the PCBA away from a wheel hub and disposed close to the PCBA at a side of the PCBA close to the wheel hub.

18. The tire pressure sensor according to claim 1, wherein the antenna is connected to a side of the PCBA close to a wheel hub.

19. The tire pressure sensor according to claim 1, wherein a shape enclosed by one turn of the antenna and the PCBA is a pentagon, a triangle, or a quadrangle.

* * * * *